United States Patent
Nakamura

(10) Patent No.: US 7,341,926 B2
(45) Date of Patent: Mar. 11, 2008

(54) WAFER DIVIDING METHOD

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 178 days.

(21) Appl. No.: 11/362,389

(22) Filed: Feb. 27, 2006

(65) Prior Publication Data

US 2006/0199355 A1     Sep. 7, 2006

(30) Foreign Application Priority Data

Mar. 1, 2005    (JP)    ............................. 2005-055788

(51) Int. Cl.
 *H01L 21/00*    (2006.01)
(52) U.S. Cl. ...................... 438/463; 438/462; 438/460; 438/464; 257/E21.596
(58) Field of Classification Search ................ 438/462, 438/460, 464, 463; 257/E21.596
See application file for complete search history.

(56) References Cited

U.S. PATENT DOCUMENTS

| 2004/0180473 | A1* | 9/2004 | Kawai | ......................... 438/114 |
| 2005/0090077 | A1 | 4/2005 | Nagai et al. | |

FOREIGN PATENT DOCUMENTS

| JP | 3408805 | 3/2003 |
| JP | 2005-129607 | 5/2005 |
| JP | 2005-294470 | 10/2005 |

* cited by examiner

*Primary Examiner*—David Zarneke
*Assistant Examiner*—Jenny L. Wagner
(74) *Attorney, Agent, or Firm*—Smith, Gambrell & Russell, LLP

(57) ABSTRACT

A method of dividing a wafer having a plurality of first dividing lines and a plurality of second dividing lines perpendicular to the plurality of first dividing lines formed on the front surface, into individual chips along the plurality of first dividing lines and the plurality of second dividing lines, comprising the steps of a deteriorated layer forming step for applying a laser beam capable of passing through the wafer along the first and second dividing lines to form a deteriorated layer in the inside of the wafer; an expansion sheet affixing step for putting the wafer on the surface of an expandable expansion sheet having an adhesive which is cured by applying an external stimulus on the surface; a first sheet expanding step for dividing the wafer into a plurality of belt-like pieces along the first dividing lines by expanding the expansion sheet in direction perpendicular to the first dividing lines and forming a space between adjacent belt-like pieces; an adhesive curing step for curing the adhesive by applying an external stimulus to the adhesive laid on the expansion sheet; and a second sheet expanding step for dividing the wafer which has been divided into the plurality of belt-like pieces along the second dividing lines, by expanding the expansion sheet in direction perpendicular to the second dividing lines.

2 Claims, 4 Drawing Sheets

WAFER DIVIDING METHOD

FIELD OF THE INVENTION

The present invention relates to a method of dividing a wafer having a plurality of dividing lines, which are formed in a lattice pattern on the surface, and functional devices formed in a plurality of areas sectioned by the plurality of dividing lines, into individual chips along the dividing lines.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas having a circuit formed thereon. An optical device wafer comprising a gallium nitride-based compound semiconductor laminated on the front surface of a sapphire substrate is also cut along predetermined dividing lines to be divided into individual optical devices such as light emitting diodes or laser diodes, which are widely used in electric appliances.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means has a rotary spindle, a cutting blade mounted on the spindle and a drive unit for rotary-driving the rotary spindle. The cutting blade is composed of a disk-like base and an annular cutting-edge which is mounted on the side wall outer peripheral portion of the base and formed as thick as about 20 μm by fixing diamond abrasive grains having a diameter of about 3 μm to the base by electroforming.

Since a sapphire substrate, silicon carbide substrate, etc. have high Mohs hardness, however, cutting with the above cutting blade is not always easy. Further, as the cutting blade has a thickness of about 20 μm, the dividing lines for sectioning devices must have a width of about 50 μm. Therefore, in the case of a device measuring 300 μm×300 μm, the area ratio of the streets to the device becomes 14%, thereby reducing productivity.

Meanwhile, as a means of dividing a plate-like workpiece such as a semiconductor wafer, a laser processing method for applying a pulse laser beam capable of passing through the workpiece with its focusing point set to the inside of the area to be divided is disclosed by Japanese Patent No. 3408805. In the dividing method making use of this laser processing technique, the workpiece is divided by applying a pulse laser beam at an infrared range capable of passing through the workpiece from one side of the workpiece with its focusing point set to the inside to continuously form a deteriorated layer in the inside of the workpiece along the dividing lines and exerting external force along the dividing lines whose strength has been reduced by the formation of the deteriorated layers.

As a means of dividing a wafer into individual chips by exerting external force along the dividing lines of the wafer having deteriorated layers formed continuously along dividing lines as described above, a technology for dividing the wafer into individual chips along the dividing lines, in which the deteriorated layer has been formed, by expanding an expansion sheet affixed to the wafer to apply tensile force to the wafer has been proposed as Japanese Patent Application No. 2003-361471 by the applicant of this application and is disclosed as JP-A 2005-129607.

However, in the method of applying tensile force to the wafer by expanding the expansion sheet affixed to the wafer, when the expansion sheet affixed to the wafer is expanded, tensile force acts on the wafer radially. Therefore, tensile force acts on the dividing lines formed in a lattice pattern in a random direction, whereby a problem arises that the wafer is divided irregularly and hence, undivided areas remain. Further, when a wafer having a metal pattern for test called "test element group (TEG)" for testing the function of each circuit on the dividing lines is divided along the dividing lines by expanding the expansion sheet as described above, irregular force acts on the above metal pattern, whereby a problem occurs that the metal pattern is broken jaggedly to reduce the quality of each device.

To solve the above problems, the present applicant proposes in Japanese Patent Application No. 2004-106279 and discloses in JP-A 2005-294470 a wafer dividing apparatus for dividing a wafer into a plurality of belt-like pieces along a plurality of first dividing lines in which a deteriorated layer has been formed by expanding an expansion sheet affixed to the wafer in direction perpendicular to the plurality of first dividing lines formed on the wafer and then, expanding the expansion sheet in direction perpendicular to a plurality of second dividing lines to divide the wafer which has been divided into the plurality of belt-like pieces along the plurality of second dividing lines in which a deteriorated layer has been formed.

In the wafer dividing method using the above-mentioned dividing apparatus, however, when tensile force exerted to the expansion sheet in the direction perpendicular to the first dividing lines is canceled after the wafer is divided into the plurality of belt-like pieces along the plurality of first dividing lines, spaces between adjacent belt-like pieces do not always become uniform and the plurality of belt-like pieces become irregular state. When the expansion sheet is expanded in the direction perpendicular to the second dividing lines from this state, tensile force cannot act on the wafer in the direction perpendicular to all the second dividing lines accurately, whereby the wafer cannot be always divided along all the second dividing lines accurately and the metal pattern for test called "test element group (TEG)" formed on the dividing lines is partially broken jaggedly.

SUMMARY OF THE INVENTION

It is an object of the present invention to provide a wafer dividing method capable of dividing along dividing lines a wafer whose strength has been reduced along the dividing lines efficiently and surely.

To attain the above object, according to the present invention, there is provided a method of dividing a wafer having a plurality of first dividing lines and a plurality of second dividing lines perpendicular to the plurality of first dividing lines formed on the front surface and functional devices formed in a plurality of areas sectioned by the plurality of first dividing lines and the plurality of second dividing lines, into individual chips along the plurality of first dividing lines and the plurality of second dividing lines, comprising the steps of:

a deteriorated layer forming step for applying a laser beam capable of passing through the wafer along the plurality of first dividing lines and the plurality of second dividing lines to form a deteriorated layer in the inside of the wafer along the plurality of first dividing lines and the plurality of second dividing lines;

an expansion sheet affixing step for putting the wafer on the surface of an expandable expansion sheet having an adhesive which is cured by applying an external stimulus to the surface before or after the above deteriorated layer forming step;

a first sheet expanding step for dividing the wafer into a plurality of belt-like pieces along the plurality of first dividing lines in which the deteriorated layer has been formed, by expanding the expansion sheet in direction perpendicular to the plurality of first dividing lines and forming a space between adjacent belt-like pieces;

an adhesive curing step for curing the adhesive by applying an external stimulus to the adhesive laid on the expansion sheet through the spaces between adjacent belt-like pieces; and a second sheet expanding step for dividing the wafer which has been divided into the plurality of belt-like pieces along the plurality of second dividing lines in which the deteriorated layer has been formed, by expanding the expansion sheet in direction perpendicular to the plurality of second dividing lines after the above adhesive curing step.

The adhesive layer laid on the surface of the above expansion sheet is made of the adhesive that is cured by ultraviolet light, and the above adhesive curing step is desirably carried out by applying ultraviolet light from the wafer side.

According to the wafer dividing method of the present invention, since the step of curing the adhesive by applying an external stimulus to the adhesive laid on the expansion sheet is carried out after the first sheet expanding step for dividing the wafer into the plurality of belt-like pieces along the plurality of first dividing lines in which the deteriorated layer has been formed by expanding the expansion sheet in the direction perpendicular to the plurality of first dividing lines and forming a space between adjacent belt-like pieces, the belt-like pieces obtained by dividing the wafer along the plurality of first dividing lines are restricted in a state where the predetermined spaces have been maintained therebetween. Therefore, in the second sheet expanding step for dividing the wafer which has been divided into the plurality of belt-like pieces along the plurality of second dividing lines in which the deteriorated layer has been formed by expanding the expansion sheet in the direction perpendicular to the plurality of second dividing lines, tensile force acts on the wafer in the direction perpendicular to the plurality of second dividing lines accurately, and the metal pattern for test called "test element group (TET)" formed on the dividing lines is also broken along the second dividing lines accurately.

DETAILED DESCRIPTION OF THE PREFERRED EMBODIMENTS

A preferred embodiment of the wafer dividing method of the present invention will be described in detail hereinunder with reference to the accompanying drawings.

Figure 1:
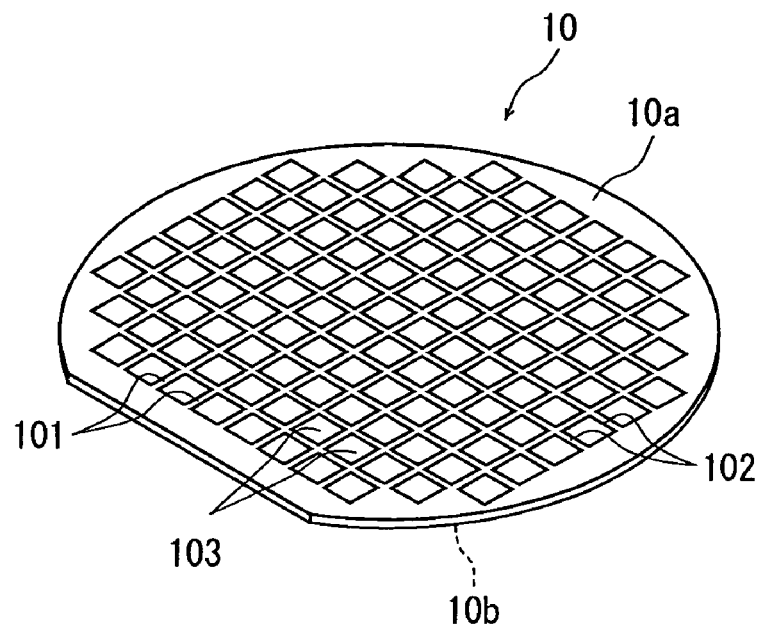
FIG. 1 is a perspective view of a semiconductor wafer to be divided into individual chips by the wafer dividing method of the present invention.

FIG. 1 is a perspective view of a semiconductor wafer as a wafer to be divided into individual chips according to the present invention. The semiconductor wafer 10 shown in FIG. 1 is a silicon wafer, and a plurality of first dividing lines 101 and a plurality of second dividing lines 102 perpendicular to the plurality of first dividing lines 101 are formed on the front surface 10a. A circuit 103 as a functional device is formed in each of a plurality of areas sectioned by the plurality of first dividing lines 101 and the plurality of second dividing lines 102 on the front surface 10a of the semiconductor wafer 10. The method of dividing this semiconductor wafer 10 into individual semiconductor chips will be described hereinunder.

To divide this semiconductor wafer 10 into individual semiconductor chips, a deteriorated layer forming step for forming a deteriorated layer in the inside of the semiconductor wafer 10 along the plurality of first dividing lines 101 and the plurality of second dividing lines 102 by applying a pulse laser beam capable of passing through the semiconductor wafer 10 along the plurality of first dividing lines 101 and the plurality of second dividing lines 102 is carried out to reduce the strength of the semiconductor wafer 10 along the dividing lines.

Figure 2:
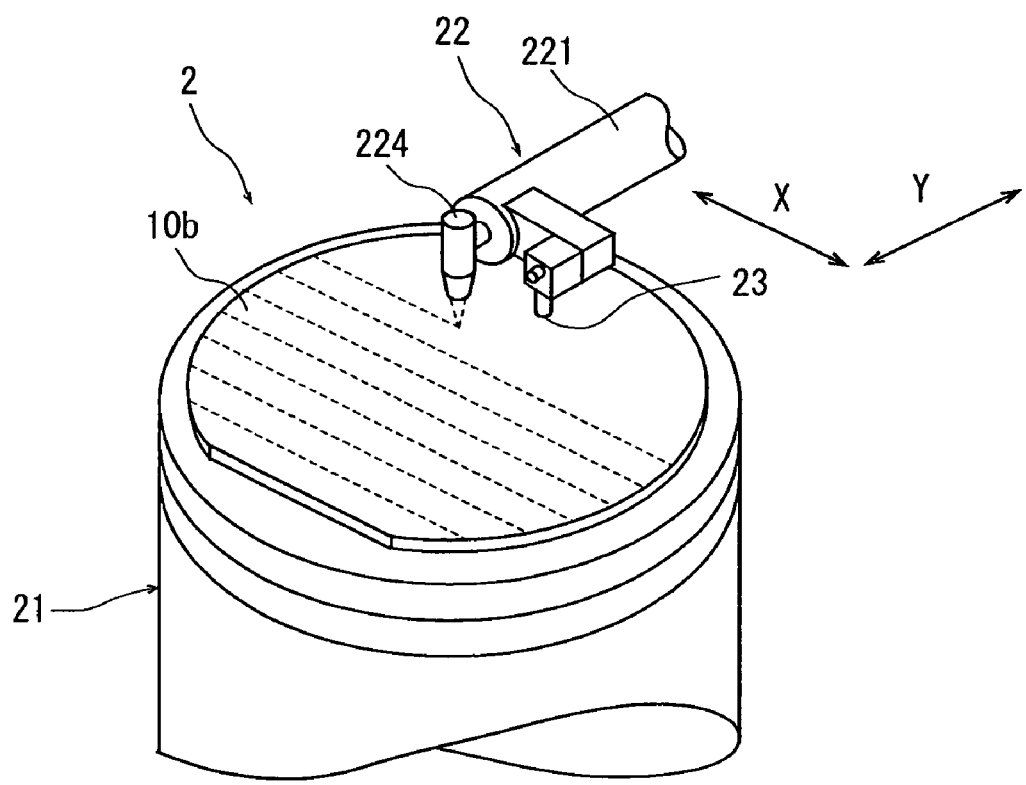
FIG. 2 is a perspective view of the principal portion of a laser beam machine for carrying out the deteriorated forming step in the wafer dividing method of the present invention.

This deteriorated layer forming step is carried out by using a laser beam processing machine 2 shown in FIG. 2. The laser beam processing machine 2 shown in FIG. 2 comprises a chuck table 21 for holding a workpiece, a laser beam application means 22 for applying a laser beam to the workpiece held on the chuck table 21, and an image pick-up means 23 for picking up an image of the workpiece held on the chuck table 21. The chuck table 21 is constituted to suction-hold the workpiece and to be moved in a processing-feed direction indicated by an arrow X and an indexing-feed direction indicated by an arrow Y in FIG. 2 by a moving mechanism that is not shown.

The above laser beam application means 22 applies a pulse laser beam from a condenser 224 mounted on the end of a cylindrical casing 221 arranged substantially horizontally. The image pick-up means 23 mounted on the end of the casing 221 constituting the above laser beam application means 22 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means which will be described later.

The deteriorated layer forming step that is carried out by using the above laser beam processing machine 2 will be described with reference to FIG. 2 and FIGS. 3(a) and 3(b).

In this deteriorated layer forming step, the semiconductor wafer 10 is first placed on the chuck table 21 of the laser beam processing machine 2 shown in FIG. 2 in such a manner that the back surface 10b faces up and suction-held on the chuck table 21. The chuck table 21 suction-holding the semiconductor wafer 10 is brought to a position right below the image pick-up means 23 by the moving mechanism that is not shown.

After the chuck table 21 is positioned right below the image pick-up means 23, alignment work for detecting the area to be processed of the semiconductor wafer 10 is carried out by the image pick-up means 23 and the control means that is not shown. That is, the image pick-up means 23 and the control means (not shown) carry out image processing such as pattern. matching, etc. to align a first dividing line 101 formed in a predetermined direction of the semiconductor wafer 10 with the condenser 224 of the laser beam application means 22 for applying a laser beam along the first dividing line 101, thereby performing the alignment of a laser beam application position. Further, the alignment of the laser beam application position is similarly carried out on the plurality of second dividing lines 102 formed on the semiconductor wafer 10 in a direction perpendicular to the plurality of first dividing lines 101. Although the front surface 10a having the plurality of first dividing lines 101 and the plurality of second dividing lines 102 formed thereon of the semiconductor wafer 10 faces down at this point, as the image pick-up means 23 comprises an infrared illuminating means, an optical system for capturing infrared radiation and an image pick-up device (infrared CCD) for outputting an electric signal corresponding to the infrared radiation as described above, images of the first dividing lines 101 and the second dividing lines 102 can be picked up through the back surface 10b.

Figure 3:
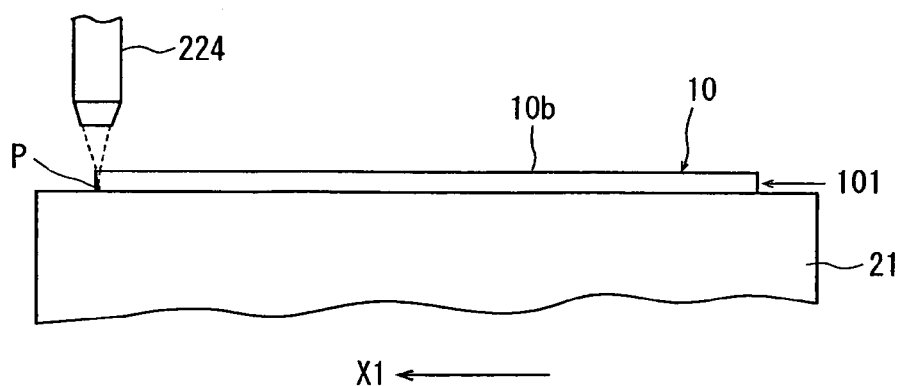
FIGS. 3(a) and 3(b) are explanatory diagrams of the deteriorated layer forming step in the wafer dividing method of the present invention.
Figure 3:
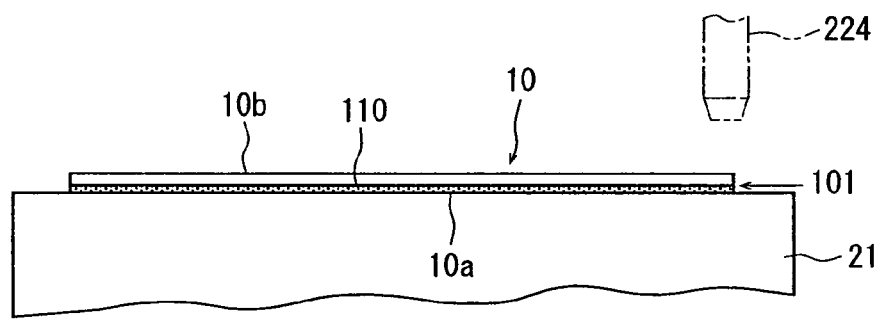

After the first dividing lines 101 and the second dividing lines 102 formed on the semiconductor wafer 10 held on the chuck table 21 are thus detected and the alignment of the laser beam application position is carried out as described above, the chuck table 21 is moved to a laser beam application area where the condenser 224 of the laser beam application means 22 for applying a laser beam is located as shown in FIG. 3(a) to bring one end (left end in FIG. 3(a)) of the predetermined first dividing line 101 to a position right below the condenser 224 of the laser beam application means 22. The chuck table 21, that is, these semiconductor wafer 10 is then moved in the direction indicated by the arrow X1 in FIG. 3(a) at a predetermined processing-feed rate while the pulse laser beam capable of passing through the semiconductor wafer 10 is applied from the condenser 224. When the application position of the condenser 224 of the laser beam application means 22 reaches the other end (right end in FIG. 3(b)) of the first dividing line 101 as shown in FIG. 3(b), the application of the pulse laser beam is suspended and the movement of the chuck table 21, that is, the semiconductor wafer 10 is stopped. In this deteriorated layer forming step, the focusing point P of the pulse laser beam is set to a position near the front surface 10a (undersurface) of the semiconductor wafer 10. As a result, a deteriorated layer 110 is exposed to the front surface 10a (undersurface) of the semiconductor wafer 10 and formed from the front surface 10a toward the inside. This deteriorated layer 110 is formed as a molten-resolidified layer (that is, the deteriorated layer has been once molten and then, re-solidified.).

The processing conditions in the above deteriorated layer forming step are set as follows, for example.
Light source: LD excited Q switch Nd:YVO4 laser
Wavelength: pulse laser beam having a wavelength of 1,064 nm
Pulse output: 10 μJ
Focusing spot diameter: 1 μm
Repetition frequency: 100 kHz
Processing-feed rate: 100 mm/sec The above deteriorated layer 110 may be formed only in the inside of the semiconductor wafer 10 without being exposed to the front surface 10a and the back surface 10b, or a plurality of deteriorated layers 110 may be formed by carrying out the above laser processing step a plurality of times by changing the above focusing spot P stepwise.

After the above deteriorated layer forming step is carried out on all the first dividing lines 101 formed in the predetermined direction of the semiconductor wafer 10, the above deteriorated layer forming step is also carried out on the second dividing lines 102.

Figure 4:
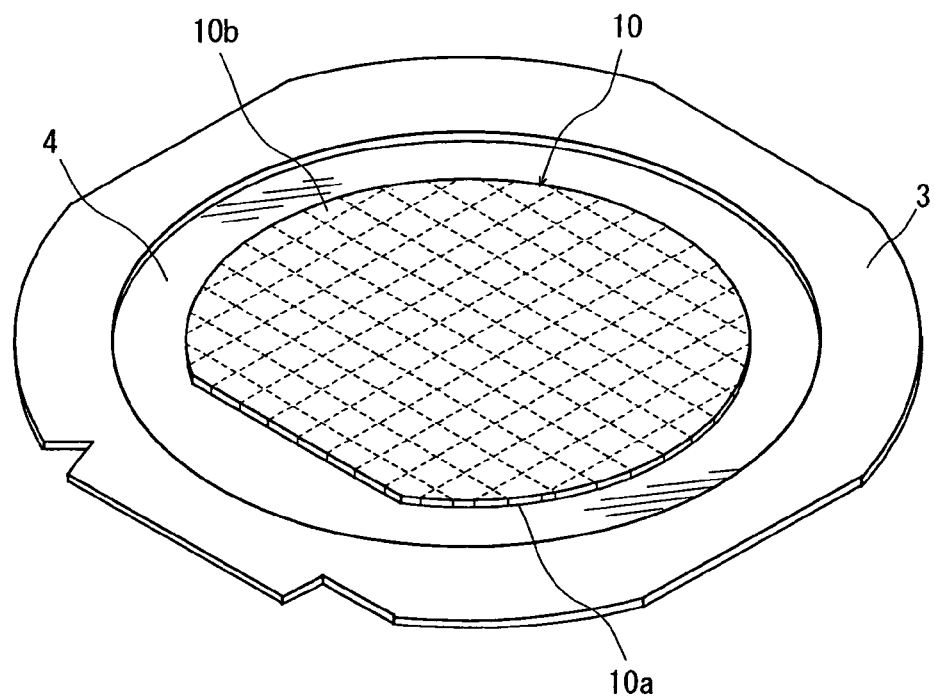
FIG. 4 is a perspective view of the wafer that has been subjected to the expansion sheet affixing step in the wafer dividing method of the present invention.

After the deteriorated layer 110 is formed in the inside of the semiconductor wafer 10 along the plurality of first dividing lines 101 and the plurality of second dividing lines 102 by the above-described deteriorated layer forming step, next comes an expansion sheet affixing step for putting the wafer on the surface of an expandable expansion sheet 4 having an adhesive which is cured by giving an external stimulus to the surface. That is, as shown in FIG. 4, the front surface 10a of the semiconductor wafer 10 is put on the surface of the expandable expansion sheet 4 whose peripheral portion is mounted onto an annular frame 3 so as to cover its inner opening. The above expansion sheet 4 has an about 5 μm-thick acrylic resin-based adhesive layer on the surface of a 100 μm-thick sheet backing made of polyvinyl chloride (PVC) in the illustrated embodiment. This adhesive has the property of curing by an external stimulus such as ultraviolet light or the like.

The above adhesive sheet affixing step may be carried out before the above deteriorated layer forming step. In this case, the deteriorated layer forming step is carried out in a state where the front surface 10a of semiconductor wafer 10 has been put on the surface of the expansion sheet 4.

Figure 5:
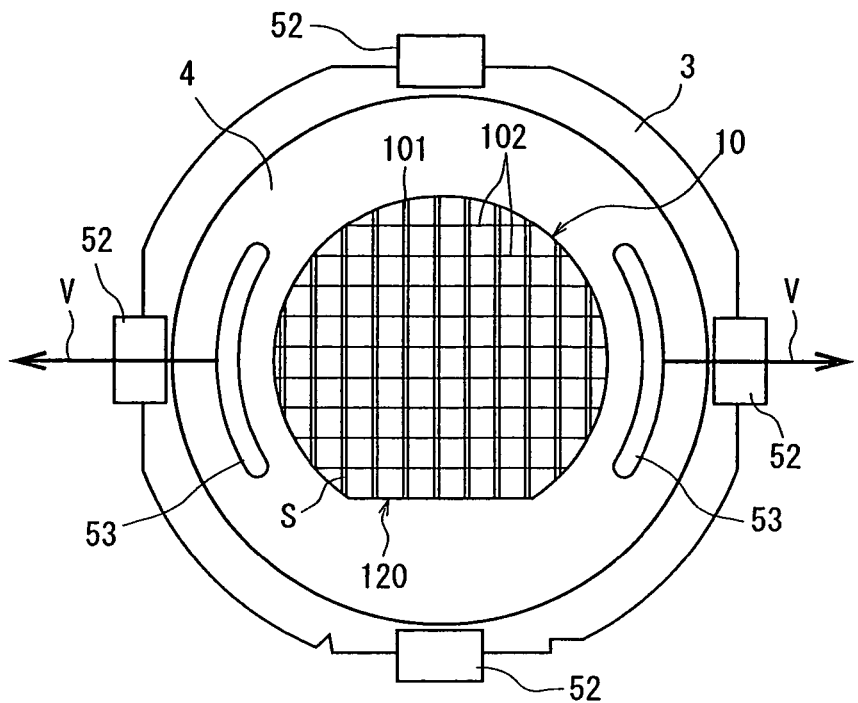
FIG. 5 is a plan view showing the first sheet expanding step in the wafer dividing method of the present invention.
Figure 6:
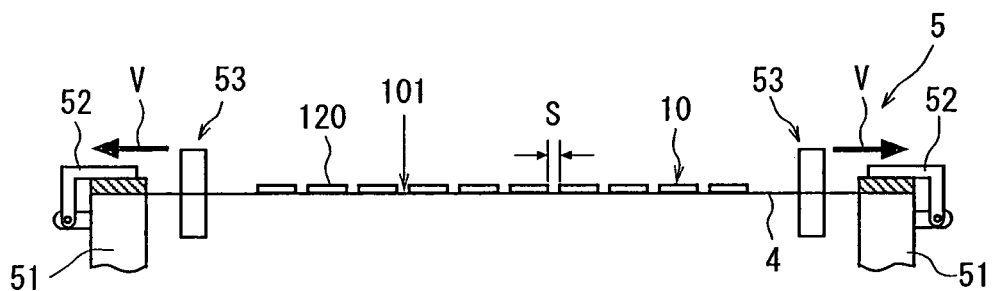
FIG. 6 is a sectional view showing the first sheet expanding step in the wafer dividing method of the present invention.

After the above deteriorated layer forming step and the adhesive sheet affixing step, next comes a first sheet expanding step for dividing the semiconductor wafer 10 into a plurality of belt-like pieces along the plurality of first dividing lines 101 in which the deteriorated layer 110 has been formed, by expanding the expansion sheet 4 in direction perpendicular to the first dividing lines 101 and forming a space between adjacent belt-like pieces. The first sheet expanding step will be described with reference to FIG. 5 and FIG. 6. In the first sheet expanding step, the annular frame 3 supporting the semiconductor wafer 10 in which the deteriorated layers 110 have been formed along the plurality of first dividing lines 101 and the plurality of second dividing lines 102 via the expansion sheet 4 is first placed on the frame holding member 51 of a sheet expanding apparatus 5, and fixed on the frame holding member 51 by clamps 52. Then, the front surface and the back surface of a portion substantially parallel to the first dividing lines 101 of the expansion sheet 4 on the outside of the semiconductor wafer 10 are nipped between nipping members 53 and 53. When the nipping members 53 and 53 are moved in right and left directions indicated by the arrows V in FIG. 5 and FIG. 6, the expansion sheet 4 is expanded in the direction perpendicular to the first dividing lines 101. As a result, tensile force acts on the semiconductor wafer 10 affixed onto the surface of the expansion sheet 4 in the direction perpendicular to the first dividing lines 101, whereby the semiconductor wafer 10 put on the surface of the expansion sheet 4 is divided into the plurality of belt-like pieces 120 along the plurality of first dividing lines 10 whose strength has been reduced by the formation of the deteriorated layers 110 and the space S is formed between adjacent belt-like pieces 120. Since tensile force acts on the semiconductor wafer 10 in the direction perpendicular to the first dividing lines 101 in this first sheet expanding step, the semiconductor wafer 10 is divided along the plurality of first dividing lines 101 accurately and the metal pattern for test called "test element group (TEG)" formed on the dividing lines is also broken along the plurality of first dividing lines 101 accurately. According to experiments conducted by the inventor of the present invention, when the expansion sheet 4 was expanded about 5 mm in the above first sheet expanding step, the semiconductor wafer 10 could be divided along the plurality of first dividing lines 101 in which the deteriorated layer was formed. At this point, the space S between adjacent belt-like pieces 120 was about 0.5 mm.

Figure 7:
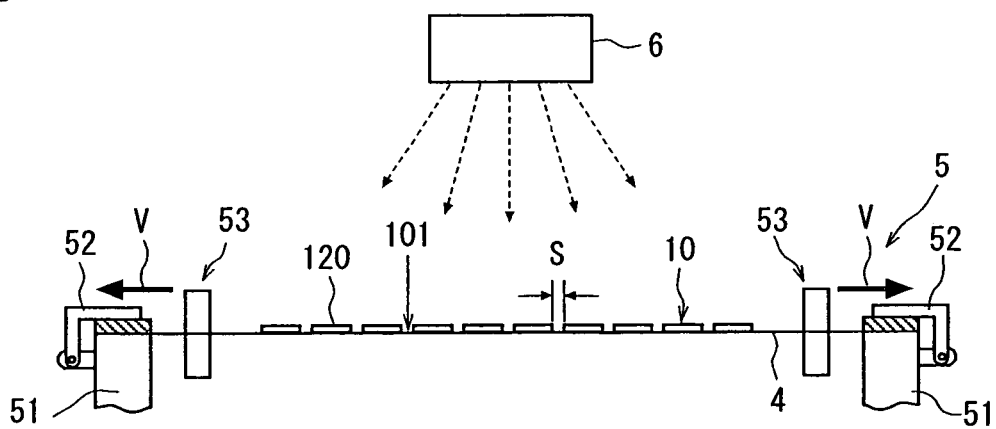
FIG. 7 is an explanatory diagram showing the adhesive curing step in the wafer dividing method of the present invention.

After the above first sheet expanding step, next comes the step of curing the adhesive by giving an external stimulus to the adhesive laid on the surface of the expansion sheet 4 through the spaces S between adjacent belt-like pieces in a state where the first sheet expanding step has been carried out. In this adhesive curing step, as shown in FIG. 7, ultraviolet light is applied from the wafer 10 side by an ultraviolet light illuminator 6 arranged above the sheet expanding apparatus 5. As a result, the adhesive laid on the surface of the expansion sheet 4 between adjacent belt-like pieces 120 is cured, and the adjacent belt-like pieces 120 of the semiconductor wafer 10 are maintained in a state where the spaces S have been formed between them.

Figure 8:
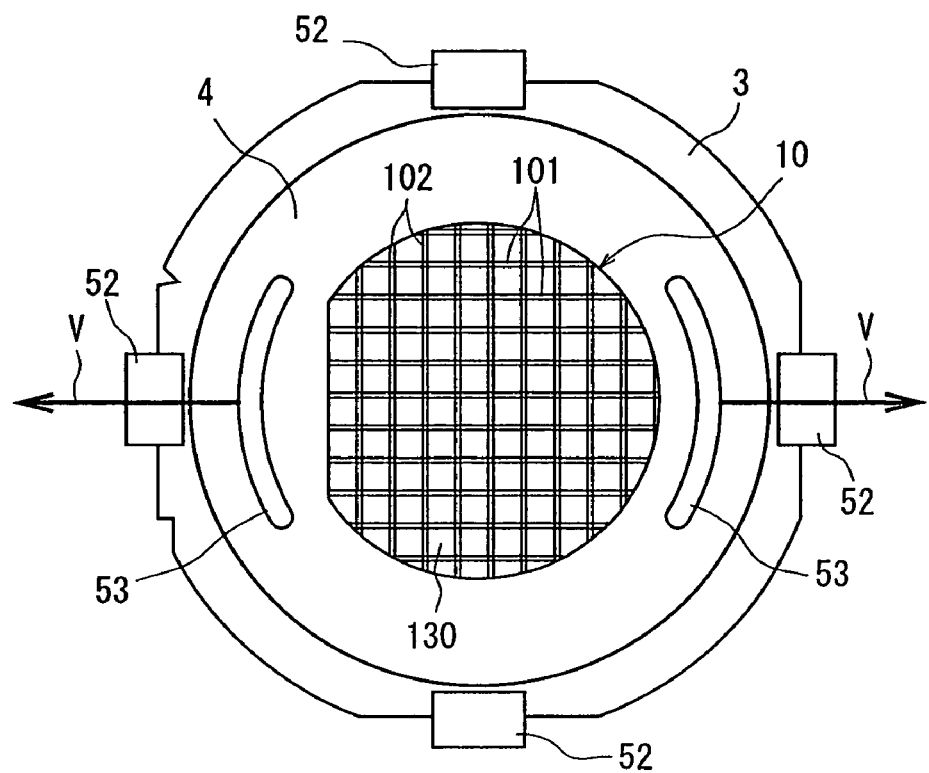
FIG. 8 is a plan view showing the second sheet expanding step in the wafer dividing method of the present invention.
Figure 9:
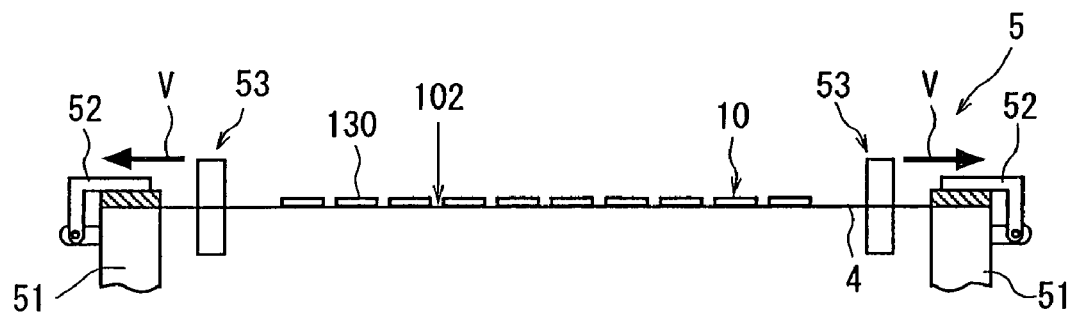
FIG. 9 is a sectional view showing the second sheet expanding step in the wafer dividing method of the present invention.

Next comes a second sheet expanding step for dividing the semiconductor wafer 10 which has been divided into the plurality of belt-like pieces 120 along the plurality of second dividing lines 102 in which the deteriorated layer 110 has been formed, by expanding the expansion sheet 4 in direction perpendicular to the second dividing lines 102. The second sheet expanding step will be described with reference to FIG. 8 and FIG. 9. In the second sheet expanding step, the annular frame 3 supporting the semiconductor wafer 10 via the expansion sheet 4 as described above is turned at 90° in a state of it has been fixed on the frame holding member 51 of the sheet expanding apparatus 5, and the front surface and the back surface of a portion substantially parallel to the second dividing lines 102 of the expansion sheet 4 on the outside of the semiconductor wafer 10 are nipped between the nipping members 53 and 53. When the nipping members 53 and 53 are moved in the right and left directions indicated by the arrows V in FIG. 8 and FIG. 9, the expansion sheet 4 is expanded in the direction perpendicular to the second dividing lines 102. As a result, tensile force acts on the semiconductor wafer 10 affixed on the surface of the expansion sheet 4 in the direction perpendicular to the second dividing lines 102, whereby the semiconductor wafer 10 (that has been divided into the plurality of belt-like pieces 120) on the surface of the expansion sheet 4 is divided along the plurality of second dividing lines 102 whose strength has been reduced by the formation of the deteriorated layers 110 to be separated into individual semiconductor chips 130. At this point, as the belt-like pieces 120 obtained by dividing the semiconductor wafer 10 along the plurality of first dividing lines 101 in the first sheet expanding step and the adhesive curing step are restricted in a state where the predetermined spaces S have been maintained therebetween, tensile force acts on the semiconductor wafer 10 in the direction perpendicular to the second dividing lines 102 accurately. Therefore, the semiconductor wafer 10 is divided along the plurality of second dividing lines 102 accurately and the metal pattern for test called "test element group (TEG)" arranged on the dividing lines is also broken along the second dividing lines 102 accurately.

What is claimed is:

1. A method of dividing a wafer having a plurality of first dividing lines and a plurality of second dividing lines perpendicular to the plurality of first dividing lines formed on the front surface and functional devices formed in a plurality of areas sectioned by the plurality of first dividing lines and the plurality of second dividing lines, into individual chips along the plurality of first dividing lines and the plurality of second dividing lines, comprising the steps of:

a deteriorated layer forming step for applying a laser beam capable of passing through the wafer along the plurality of first dividing lines and the plurality of second dividing lines to form a deteriorated layer in the inside of the wafer along the plurality of first dividing lines and the plurality of second dividing lines;

an expansion sheet affixing step for putting the wafer on the surface of an expandable expansion sheet having an adhesive which is cured by applying an external stimulus to the surface before or after the above deteriorated layer forming step;

a first sheet expanding step for dividing the wafer into a plurality of belt-like pieces along the plurality of first dividing lines in which the deteriorated layer has been formed, by expanding the expansion sheet in direction perpendicular to the plurality of first dividing lines and forming a space between adjacent belt-like pieces;

an adhesive curing step for curing the adhesive by applying an external stimulus to the adhesive laid on the expansion sheet through the spaces between adjacent belt-like pieces; and a second sheet expanding step for dividing the wafer which has been divided into the plurality of belt-like pieces along the plurality of second dividing lines in which the deteriorated layer has been formed, by expanding the expansion sheet in direction perpendicular to the plurality of second dividing lines after the above adhesive curing step.

2. The method of dividing a wafer according to claim 1, wherein the adhesive laid on the surface of the expansion sheet has the property of curing with ultraviolet light, and the adhesive curing step is carried out by applying ultraviolet light from the wafer side.

* * * * *